(12) United States Patent
Grasso et al.

(10) Patent No.: US 7,337,527 B2
(45) Date of Patent: Mar. 4, 2008

(54) METHOD INCLUDING A HEAT TREATMENT OF MANUFACTURING SUPERCONDUCTING WIRES BASED ON $MGB_2$

(75) Inventors: Giovanni Grasso, Genova (IT); Andrea Malagoli, Genova (IT)

(73) Assignee: INFM Istituto Nazionale per la Fisica Della Materia, Genoa (IT)

( * ) Notice: Subject to any disclaimer, the term of this patent is extended or adjusted under 35 U.S.C. 154(b) by 0 days.

(21) Appl. No.: 10/492,791

(22) PCT Filed: Oct. 16, 2002

(86) PCT No.: PCT/EP02/11567

§ 371 (c)(1),
(2), (4) Date: Apr. 16, 2004

(87) PCT Pub. No.: WO03/035575

PCT Pub. Date: May 1, 2003

(65) Prior Publication Data

US 2004/0250410 A1 Dec. 16, 2004

(30) Foreign Application Priority Data

Oct. 19, 2001 (IT) .......................... TO2001A0994

(51) Int. Cl.
*H01L 39/24* (2006.01)
(52) U.S. Cl. .......................................... 29/599; 29/825
(58) Field of Classification Search ................. 29/825, 29/599; 174/125.1, 135.1; 505/430, 433
See application file for complete search history.

(56) References Cited

U.S. PATENT DOCUMENTS 6,687,975 B2* 2/2004 Tomsic ......................... 29/599
6,878,420 B2* 4/2005 Cheong et al. ............. 427/561

FOREIGN PATENT DOCUMENTS

WO    WO 02 073709 A    9/2002

OTHER PUBLICATIONS

S. Soltanian, et al.: "High-transport Critical Current Density Above 30K in Pure Fe-clad MgB/sub2/tape", Physica C. Sep. 1, 2001, Elsevier, Netherlands, vol. 361, No. 2, pp. 84-90, XP002226797, ISSN: 0921-4534, see p. 84-85.
B.A. Glowachi, et al.: "Superconductin Properties of the Powder-in-tube CU=MG-B and Ag-Mg-B wires" Physica C 372-376 Part 2, Aug. 2002, [Online] XP002226798, Retrieved from the Internet: URL:http:www.elsevier.com.locate/phys [retrieved on Dec. 16, 2002], pp. 1254-1257, see pp. 1254, col. 2.
H. Kumakura, et al.: "High Transport Critical Current Density Obtained for Powder-in-tube-processed <gB/sub2/tapes and wires using stainless steel and Cu-Ni Tubes", Applied Physics Letters, Oct. 8, 2001, AIP, USA, vol. 79, No. 15, pp. 2435-2437, XP002226799, ISSN: 0003-6951, see p. 2435, col. 1, lline 1—col. 2, line 6.
J. Nagamatsu, et al.: "Superconductivity at 39K in Magnesium Diboride", Nature, vol. 410, pp. 63-64, Mar. 1, 2001.
C. Ferdeghini et al.: "Large Transport Critical Currents in Unsintered $MgB_2$ Superconducting Tapes", Applied Physics Letters, vol. 79, No. 2, pp. 230-232, Jul. 9, 2001.
M.D. Sumption, et al.: "Transport Current $MgB_2$ Based Superconducting Strand at 4.2 K and Self-field", 2001 Preprint Collection, cond-mat/0103179.
High Critical Currents in Iron-Clad Superconducting $MgB_2$ Wires; Mavoori, et al.; Letters to Nature; vol. 411, 31, May 2001.
Superconductivity of Powder-in-Tube $MgB_2$ Wires; Glowacki, et al.; Superconduction Science and Technology; Institute of Physics Publishing; © 2001 IOP Publishing Ltd. 0953-2048/01/040193+07.

* cited by examiner

*Primary Examiner*—Carl J. Arbes
(74) *Attorney, Agent, or Firm*—Sughrue Mion, PLLC

(57) ABSTRACT

A method of manufacturing superconducting wires based on $MgB_2$ is described and includes the steps of: production of a cylindrical wire comprising an $MgB_2$ core surrounded by a metal covering, in which the core has a lattice structure formed by grains of the compound $MgB_2$; rolling of the wire to produce a conductor in tape form; and subsequent heat treatment by heating to a temperature of between 800° C. to 870° C. This last step helps to increase the connection between the $MgB_2$ grains whilst retaining the structural defects produced in the rolling step, thus producing a superconducting wire with greater current-transport capacity.

15 Claims, 2 Drawing Sheets

Figure 1A:
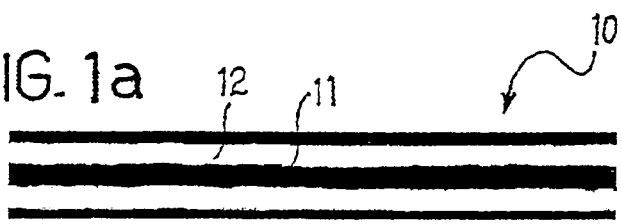

METHOD INCLUDING A HEAT TREATMENT OF MANUFACTURING SUPERCONDUCTING WIRES BASED ON $MGB_2$

This is a National Stage entry of Application No. PCT/EP02/11567 filed Oct. 16, 2002; the disclosure of which is incorporated herein by reference.

BACKGROUND OF THE INVENTION

The present invention relates in general to the technological field of superconducting materials and components and, more specifically, relates to a method of manufacturing superconducting tapes or wires based on $MgB_2$.

Superconductivity is a phenomenon which has important applicational aspects, above all with regard to the production of high static magnetic fields. Amongst the large-scale industrial applications of superconducting materials, when they are processed in the form of superconducting wires, are magnets for medical magnetic resonance MRI (in which the static magnetic field generated by the superconductor reaches a value of 1-3 Tesla) and for NMR spectrometry (in which the generated static magnetic field reaches the value of 20 Tesla).

The superconducting materials which are most commonly used in industrial applications are two binary compounds based on niobium, that is NbTi and $Nb_3Sn$. They have superconductive transition temperatures below 20K and therefore offer properties adequate to justify their advantageous use only at working temperatures of between 1.5 K and 4.2 K, which can be reached by suitable cooling in a liquid helium bath.

At the moment, the limitations of the compounds NbTi and $Nb_3Sn$ are a low critical magnetic field, which therefore limits its applicability in magnetic fields of up to about 7-9 Tesla, and great fragility, high cost and complexity of manufacture, respectively.

The recent discovery of the superconductivity phenomenon in the simple binary compound $MgB_2$ (magnesium diboride) which has a transition temperature of about 40K (the highest ever detected for a binary compound) opens up new prospects for the application of this material in competition with the compounds which have been known for some time and optimized in the form of superconducting cables in the course of the last few decades.

This discovery is mentioned by J. Nagamatsu, N. Nakagawa, T. Muranaka, Y. Zenitani and J. Akimitsu in an article entitled "Superconductivity at 39K in magnesium diboride" which appeared in the journal Nature, volume 410, pages 63-64, published on 1 Mar. 2001.

A method of manufacturing tape conductors based on $MgB_2$ with a metal covering by the so-called-powder-in-tube technique is known in the literature from the article by the inventors in collaboration with C. Ferdeghini, S. Roncallo, V. Braccini, and A. Siri, entitled "Large transport critical currents in unsintered $MgB_2$ superconducting tapes", published in Applied Physics Letters, vol. 79, No. 2, pages 230-232, of 9 Jul. 2001.

According to the teachings of the article, already-reacted high-purity powders of the compound $MgB_2$ are poured into a metal tube and compacted therein. The tube is then processed cold by drawing and rolling to form a small-diameter superconducting wire whilst maintaining a geometrical shape of circular cross-section and, finally, to produce a tape conductor.

The conductor thus formed is constituted by an outer metal covering and an inner core based on magnesium and boron which has substantially a lattice structure formed by grains of the compound $MgB_2$.

The conductors thus produced have a critical current density of about $10^5$ $A/cm^2$ at a temperature of 4.2 K.

Cold mechanical processing promotes the compaction of the compound $MgB_2$ and its agglomeration, producing structural defects in the crystalline lattice of the $MgB_2$ grains which improve its superconducting properties.

The article "Transport current in $MgB_2$ based superconducting strand at 4.2 K and self-field" by M. D. Sumption, X. Peng, E. Lee, M. Tomsic and E. W. Collings published in the 2001 Preprint collection, cond-mat/0103179, describes a similar process in which a step of sintering by heating to 900° C. with a duration of 1 hour or more follows the rolling operation in order to increase the connection between the $MgB_2$ grains making up the core of the conductor, cancelling out the structural defects produced by the mechanical processing.

SUMMARY OF THE INVENTION

The object of the present invention is to define a method of manufacturing superconducting cables based on the compound $MgB_2$ which enables superconductive properties better than those of known conductors to be achieved, possibly at a lower cost and with a higher working temperature.

According to the present invention, this object is achieved by means of a method having the characteristics claimed in claim 1.

The method of the invention permits the production of superconducting cables based on $MgB_2$ with significantly improved properties with regard to current transport without dissipation, even in the presence of a static magnetic field.

DETAILED DESCRIPTION OF THE INVENTION

The method, which comprises the steps of cold mechanical processing (drawing, rolling) alternating with or followed by one or more bakings in a controlled atmosphere, advantageously not only enables defects to be introduced into the crystalline structure of the compound $MgB_2$ and its degree of compaction to be increased, reducing its particle size to a sub-micrometric dimension, but also permits the production of a superconducting wire with a greater capacity to transport current without appreciable dissipation, up to working temperatures of about 20K-30K.

The achievement of superconductive properties in materials at temperatures above 10K, and foreseeably up to 20K, allows these materials and the components derived therefrom to be used in association with modern cryo-refrigeration systems which no longer require the use of cryogenic liquids.

DETAILED DESCRIPTION OF THE DRAWINGS

Figure 1B:
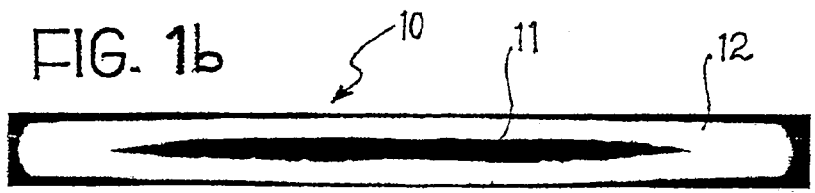
Figure 2A:
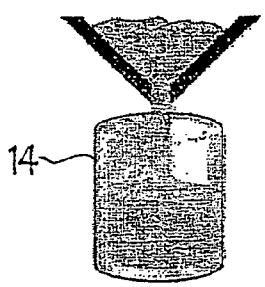
Figure 2B:
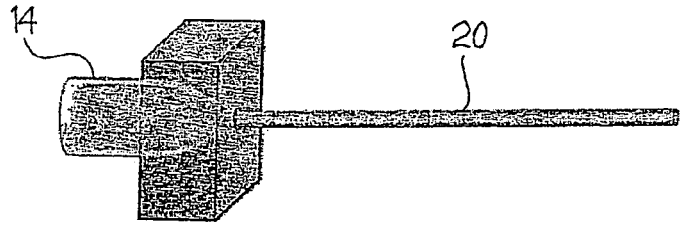
Figure 2C:
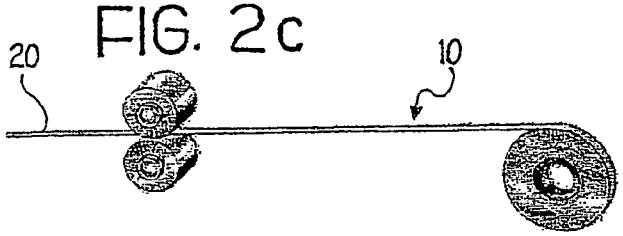
Figure 2D:
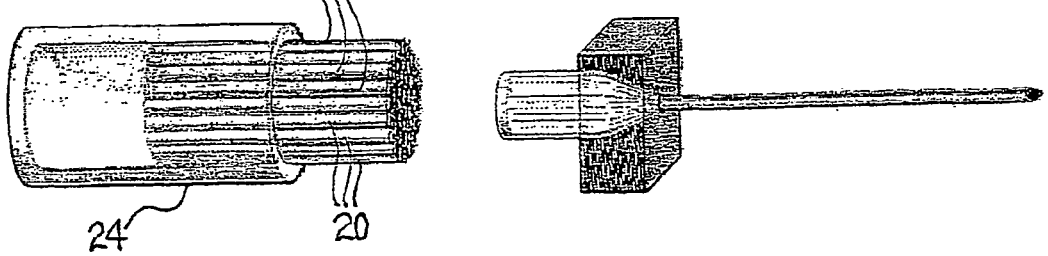
Figure 3:
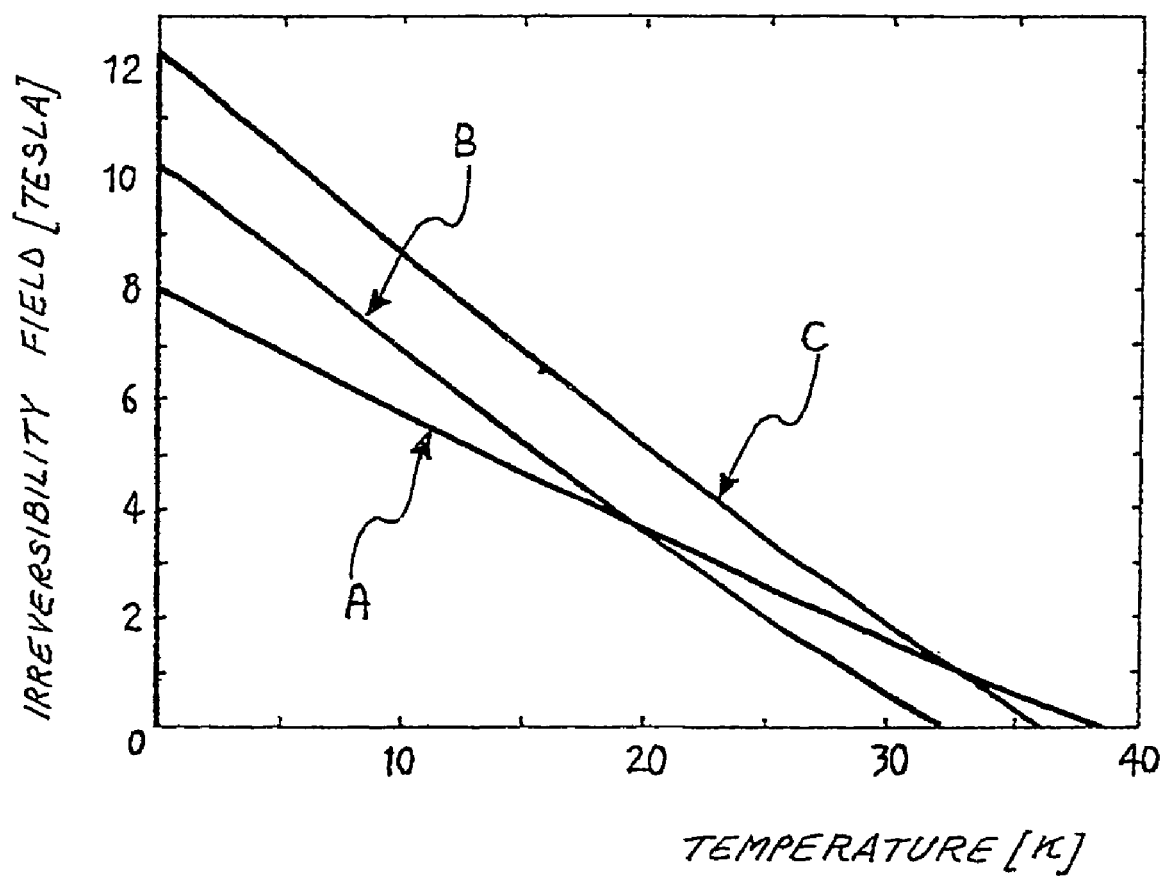

Further characteristics and advantages of the invention will be explained in greater detail in the following detailed description, given by way of non-limiting example with reference to the appended drawings, in which:

FIGS. 1a and 1b are a partial view in longitudinal section and a view in transverse section, respectively, of a tape conductor manufactured in accordance with the invention, FIGS. 2a-2d are schematic views showing the various stages of cold mechanical processing in a method of manufacturing a superconducting wire, and FIG. 3 is a graph which shows the irreversibility lines and the domain of applicability of a superconducting wire as a function of its working temperature and of the static magnetic field applied.

FIGS. 1a and 1b show a flattened tape or wire conductor 10 formed by an $MgB_2$ core 11 surrounded by a metal containing and protective covering 12.

According to a first embodiment of the invention, the conductor 10 is manufactured from powders of the compound $MgB_2$, already formed and having a high degree of purity (>95%). The $MgB_2$ phase; which is available commercially, can be produced by known methods by reaction of a mixture of fine magnesium and boron powders in predefined stoichiometric ratios (1:2), heated to a temperature of between 900° C. and 950° C. inside a sealed capsule made of tantalum or iron or, in general, formed by an element or alloy which does not have a chemical reaction with the constituents of the superconducting phase, in an argon-based atmosphere. The duration of the process is about 10 hours. The $MgB_2$ compound thus reacted is in the form of powders which are normally ground to produce a more homogeneous particle size.

These powders are introduced into a metal tube 14 having an outside diameter of between about 6 mm and 30 mm, the length of which is selected in dependence on the total quantity of superconducting wire to be produced. The thickness of the tube wall is selected in dependence on its outside diameter in a manner such that the central hole represents about 20% to 50% of the total volume of the tube (this approximately corresponds to a ratio of between about 1.3 and about 2.5 between the outside and inside diameters). The tube is preferably composed of iron, nickel, copper, or alloys thereof.

The step of the introduction of the $MgB_2$ powders into the tube 14 is shown schematically in FIG. 2a. The compaction of the powders inside the tube may advantageously be promoted by the application of a pressure of about 100 MPa by means of a hardened-steel piston, in a controlled atmosphere to prevent contamination by atmospheric agents. The ends of the tube are then sealed with deformable plugs in accordance with the prior art, typically made of tin or lead.

With reference to FIG. 2b, the tube is then processed cold by drawing or rolling in grooves to form wire of circular or polygonal cross-section (wire 20 illustrated) with successive steps of approximately 10% reduction of the cross-section. The diameter of the wire is thus reduced to a value of between about 0.5 mm and 3 mm, without changing its geometrical shape.

A rolling step (shown schematically in FIG. 2c) is then performed with steps of approximately 10% reduction of the thickness to produce a flattened conductor wire having the appearance shown in FIGS. 1a and ib, the thickness of which is of the order of about 0.3 mm.

Similarly, according to a manufacturing variant, it is possible to produce a multi-filament conductor as shown in FIG. 2d by performing, prior to the rolling, a second drawing operation of a bundle of semi-finished wires 20 produced by a first drawing operation and arranged beforehand in a second container tube 24.

The superconducting wire produced by the series of cold mechanical processes described above is then heated to a temperature of between about 800° C. and 870° C.

The above-mentioned heat treatment is preferably performed by one of two different methods such as heating in an oven or heating by Joule effect. In the first case the "baking" is continued for a period no longer than 60 minutes in a controlled atmosphere constituted by a mixture rich in argon or another inert gas, possibly with a residual oxygen presence (<20%). In the second case, the current is caused to flow between two metal pulleys over which the superconducting wire runs. In the heated region, the wire is kept at high temperature for about 60 seconds and in a partial vacuum by pumping with a diaphragm pump or a mechanical pump.

According to a variant, the heat treatment provided for may be performed in several stages during the mechanical processing steps.

The complex mechanical processing, performed on the $MgB_2$ phase, leads to a considerable compaction of the superconducting powders, promoting their agglomeration as well as a high degree of distortion of the crystalline lattice of the $MgB_2$ grains and their partial fragmentation. The superconducting properties of the $MgB_2$ phase can thus be greatly influenced since, as is well known, structural defects—if they are distributed evenly (separation comparable with the-London penetration depth which, for the compound $MgB_2$, is about 150 nm) and of an extent comparable with that of the superconductive coherence length (about 5 nm)—give rise to an improvement in the superconduction properties, particularly in the presence of an intense static magnetic field. The effect of the structural defects in superconducting particles is similar to the effect produced by grain boundaries.

The high-temperature treatment step improves the connection between the $MgB_2$ grains whilst retaining some of the structural defects produced by the mechanical processing and, in the final analysis, leads to an increase in the superconductive transition temperature.

The superconductor thus shows improved behaviour in the presence of a magnetic field and is suitable for use for the manufacture of magnets for the production of strong static magnetic fields.

Laboratory tests have been performed to demonstrate the achievement of improved current-transport capacities of a wire 10 such as that shown in FIG. 1, produced in accordance with the method of the invention.

The graph of FIG. 3 shows the irreversibility lines for three superconducting components, that is, the compound $MgB_2$ in crude form (curve A), a wire produced purely by cold mechanical processing (curve B), and a wire produced by cold mechanical processing and subsequent heat treatment at 800° C. (curve C), respectively.

The region subtended by the irreversibility lines is indicated as the domain of applicability of a superconducting wire and is defined as a function of its working temperature (given on the abscissa) and of the static magnetic field applied (given on the ordinate).

It can be seen that the superconducting wires which have been subjected to heat treatment in addition to cold mechanical processing have a larger domain of applicability than that relating to the untreated compound, particularly in the region of low working temperatures. The enlargement in the domain of applicability of conductors based on $MgB_2$ is appreciable particularly in the light of a comparison with the performance of competing superconducting cables based on NbTi.

It is to be expected that further improvements in the superconducting properties of wires or tapes based on $MgB_2$ may be achieved by supporting the cold mechanical processing steps with chemical treatments to form defects in the crystalline lattice of the superconductor, for example, by partial substitution of one or both of the elements of the compound $MgB_2$.

In a second embodiment of the invention which is mentioned briefly herein, in order further to increase the speed and economy of the method of manufacture, a mixture of fine magnesium and boron powders in predefined stoichiometric ratios (Mg-2B) is poured into the metal covering tube, which is based exclusively on iron.

The tube is then processed cold by drawing or rolling in grooves to form wire of circular or polygonal cross-section, as explained in detail with reference to the first embodiment. A further drawing of the semi-finished product is then performed through a hexagonal die (having an apothem substantially corresponding to half of the diameter reached by the wire), and a heat treatment operation is then performed to bring about the reaction between the components of the mixture.

The wire (now with a hexagonal cross-section) is then divided into a predefined number of pieces (for example, 7, 19 or 37) in dependence on its length, and these are grouped in a bundle and inserted in a second, iron or nickel container tube. The drawing and rolling operations (shown in FIGS. 2b and 2c) and the "baking" operation are then performed in accordance with the sequence referred to above, in which the cold mechanical processing precedes the heat treatment or may be performed in alternation therewith.

Naturally, the principle of the invention remaining the same, the forms of embodiment and details of construction may be varied widely with respect to those described and illustrated purely by way of non-limiting example, without thereby departing from the scope of protection of the present invention defined by the appended claims.

What is claimed is:

1. A method of manufacturing superconducting wires (10) based on $MgB_2$, including the steps of:
   production of a cylindrical wire (20) of predefined transverse dimensions, comprising an $MgB_2$ core (11) surrounded by a metal covering (12), in which the core (11) has substantially a lattice structure formed by grains of the compound $MgB_2$, the wire (20) being obtainable by drawing of a metal tube (14) into which are introduced beforehand the compound $MgB_2$ or its elemental precursors, subsequently subjected to reaction, and
   rolling of the wire (20) to produce a conductor (10) in tape form, at the same time producing structural defects in the lattice of $MgB_2$ grains,
   characterized in that it comprises a step of heat treatment of the conductor (10) in tape form by heating to a temperature of between 800° C. and 870° C. so as to increase the connection between the $MgB_2$ grains whilst substantially maintaining the structural defects produced in the rolling step,
   wherein a further step of heat treatment of the cylindrical wire (20) by heating to a temperature of between 800° C. and 870° C. precedes said rolling step; and
   wherein the heat treatment step is performed in several stages in the course of the rolling step.

2. A method according to claim 1 in which the cylindrical wire (20) is produced by drawing of a metal tube (14) into which powders of the superconducting compound $MgB_2$ are introduced beforehand.

3. A method according to claim 1 in which the cylindrical wire (20) is produced by drawing of a metal tube (14) into which a mixture of magnesium and boron powders in a stoichiometric ratio of 1:2 is introduced beforehand, the mixture being subjected to reaction to synthesize the compound $MgB_2$ after the drawing operation.

4. A method according to claim 2, characterized in that the heat treatment is achieved by heating in an oven for a period of about 1 hour in an atmosphere of argon and oxygen.

5. A method according to claim 2, characterized in that the heat treatment is achieved by heating, by the Joule effect, of successive portions of conductor (10), kept in a partial vacuum, for a period of about 1 minute for each portion of conductor (10).

6. A method according to claim 5 in which, in the course of the heat treatment step, the conductor (10) is moved between a pair of metal pulleys in which an electrical current flows, which current is of an intensity such as to produce a region of heating of the conductor (10) in the vicinity of the pulleys.

7. A method according to claim 2, characterized in that the drawing step is performed with successive steps of approximately 10% reduction of the cross-sectional area of the conducting wire (20), to reach a wire diameter value of between about 0.5 mm and 3 mm.

8. A method according to claim 1, characterized in that the metal tube (14) has an outside diameter of between about 6 mm and 30 mm, and in that the thickness of the wall of the tube (14) is selected, in dependence on its outside diameter, in a manner such that the central hole represents from about 20% to 50% of the total volume of the tube (14).

9. A method according to claim 2, characterized in that the metal tube (14) is made of iron, nickel, copper, or alloys thereof.

10. A method according to claim 3, characterized in that the metal tube (14) is made of iron.

11. A method according to claim 1, characterized in that the step of introducing powders of the compound $MgB_2$ or of its elemental precursors into the metal tube (14) is followed by a step of compaction of the powders by the application of a pressure of about 100 MPa.

12. A method according to claim 11, characterized in that the powder compaction step is carried out in a controlled atmosphere.

13. A method according to claim 11, characterized in that, after the powder compaction step, the ends of the tube (14) are sealed with deformable plugs made of tin or lead.

14. A method of manufacturing superconducting wires (10) based on $MgB_2$, including the steps of:
   production of a cylindrical wire (20) of predefined transverse dimensions, comprising an $MgB_2$ core (11) surrounded by a metal covering (12), in which the core (11) has substantially a lattice structure formed by grains of the compound $MgB_2$, the wire (20) being obtainable by drawing of a metal tube (14) into which are introduced beforehand the compound $MgB_2$ or its elemental precursors, subsequently subjected to reaction, and
   rolling of the wire (20) to produce a conductor (10) in tape form, at the same time producing structural defects in the lattice of $MgB_2$ grains,
   characterized in that it comprises a step of heat treatment of the conductor (10) in tape form by heating to a temperature of between 800° C. and 870° C. so as to increase the connection between the $MgB_2$ grains whilst substantially maintaining the structural defects produced in the rolling step, wherein the rolling step is performed with successive steps of approximately 10% reduction in the thickness of the conductor wire (20), to reach a value of the thickness of the flattened conducting wire (10) of the order of about 0.3 mm.

15. A method of manufacturing superconducting wires (10) based on $MgB_2$, including the steps of:

production of a cylindrical wire (20) of predefined transverse dimensions, comprising an $MgB_2$ core (11) surrounded by a metal covering (12), in which the core (11) has substantially a lattice structure formed by grains of the compound $MgB_2$, the wire (20) being obtainable by drawing of a metal tube (14) into which are introduced beforehand the compound $MgB_2$ or its elemental precursors, subsequently subjected to reaction, rolling of the wire (20) to produce a conductor (10) in tape form, at the same time producing structural defects in the lattice of $MgB_2$ grains, heat treating the conductor (10) in tape form by heating to a temperature of between 800° C. and 870° C. so as to increase the connection between the $MgB_2$ grains whilst substantially maintaining the structural defects produced in the rolling step, wherein the cylindrical wire (20) is produced by drawing of a metal tube (14) into which powders of the superconducting compound $MgB_2$ are introduced beforehand and wherein the rolling step is preceded by a series of consecutive steps, comprising:

the grouping in a bundle of a plurality of cylindrical conductor wires (20) produced by a drawing operation, the arrangement of the bundle thus formed in a second metal tube (24), and a second drawing step, so as to produce a multifilament conductor.

* * * * *